US 8,063,426 B2
Nov. 22, 2011

(12) United States Patent
Visser et al.

(54) FAST SWITCHING POWER INSULATED GATE SEMICONDUCTOR DEVICE

(75) Inventors: Barend Visser, Potchefstroom (ZA); Ocker Cornelis De Jager, Potchefstroom (ZA)

(73) Assignee: North-West University, Potschefstroom (ZA)

( * ) Notice: Subject to any disclaimer, the term of this patent is extended or adjusted under 35 U.S.C. 154(b) by 228 days.

(21) Appl. No.: 12/021,037

(22) Filed: Jan. 28, 2008

(65) Prior Publication Data
US 2008/0203457 A1   Aug. 28, 2008

Related U.S. Application Data

(63) Continuation of application No. 10/542,720, filed as application No. PCT/ZA2004/000005 on Jan. 21, 2004, now abandoned.

(30) Foreign Application Priority Data

Jan. 21, 2003   (ZA) .................................. 2003/0552

(51) Int. Cl.
*H01L 27/108*   (2006.01)
(52) U.S. Cl. ............... 257/312; 257/595; 257/E29.345; 257/E21.364; 438/379
(58) Field of Classification Search .................. 257/340, 257/331 E21.419 E23.019
See application file for complete search history.

(56) References Cited

U.S. PATENT DOCUMENTS

| | | | |
|---|---|---|---|
| 3,883,413 A | 5/1975 | Douglas-Hamilton | |
| 4,038,165 A | 7/1977 | Lowther | |
| 4,438,356 A | 3/1984 | Fleischer | |
| 4,471,245 A | 9/1984 | Janutka | |
| 4,491,807 A | 1/1985 | Hoover | |
| 4,683,387 A * | 7/1987 | Jones et al. | 327/424 |
| 4,695,936 A | 9/1987 | Whittle | |
| 4,713,220 A | 12/1987 | Huynh et al. | |
| 4,736,121 A | 4/1988 | Cini et al. | |
| 4,764,857 A | 8/1988 | Konopka | |
| 4,796,174 A | 1/1989 | Nadd | |
| 4,869,881 A | 9/1989 | Collins | |
| 4,873,460 A | 10/1989 | Rippel | |
| 4,912,335 A | 3/1990 | Ehalt et al. | |
| 5,016,070 A | 5/1991 | Sundaresan | |
| 5,140,201 A | 8/1992 | Uenishi | |

(Continued)

FOREIGN PATENT DOCUMENTS

DE   19905421   8/2000

(Continued)

OTHER PUBLICATIONS

Vishay Datasheet of N-Channel 240-V MOSFETS TN2410L, VN2406D/L, VN2410L/LS; Jul. 16, 2001; pp. 11-1-11-5; URL:www.vishay.com.

(Continued)

*Primary Examiner* — Steven Loke
*Assistant Examiner* — David Goodwin
(74) *Attorney, Agent, or Firm* — Alston & Bird LLP

(57) ABSTRACT

An insulated gate semiconductor device (30) includes a gate (34), a source terminal (36), a drain terminal (38) and a variable input capacitance at the gate. A ratio between the input capacitance ($C_{fiss}$) when the device is on and the input capacitance $C_{iiss}$ when the device is off is less than two and preferably substantially equal to one. This is achieved in one embodiment of the invention by an insulation layer 32 at the gate having an effective thickness $d_{ins}$ larger than a minimum thickness.

18 Claims, 13 Drawing Sheets

U.S. PATENT DOCUMENTS

| | | |
|---|---|---|
| 5,392,187 A | 2/1995 | Baliga |
| 5,475,333 A | 12/1995 | Kumagai |
| 5,504,449 A | 4/1996 | Prentice |
| 5,977,588 A * | 11/1999 | Patel .................. 257/328 |
| 6,291,298 B1 * | 9/2001 | Williams et al. .......... 438/270 |
| 6,441,652 B1 | 8/2002 | Qian |
| 6,566,708 B1 | 5/2003 | Grover et al. |
| 6,573,560 B2 | 6/2003 | Shenoy |
| 6,589,830 B1 | 7/2003 | Zeng |
| 6,690,062 B2 | 2/2004 | Henninger et al. |
| 6,707,102 B2 | 3/2004 | Morikawa et al. |
| 6,759,835 B2 | 7/2004 | Turvey et al. |
| 6,858,895 B2 | 2/2005 | Feldtkeller et al. |
| 6,870,220 B2 * | 3/2005 | Kocon et al. .................. 257/340 |
| 6,870,405 B2 | 3/2005 | Visser |
| 2003/0173619 A1 | 9/2003 | Feldtkeller et al. |
| 2004/0251484 A1 | 12/2004 | Miyazaki et al. |

FOREIGN PATENT DOCUMENTS

| | | |
|---|---|---|
| EP | 1096573 | 5/2001 |
| GB | 2 206 731 A | 1/1989 |
| JP | 60038877 A | 2/1985 |
| JP | 5507385 T | 10/1993 |
| JP | 8321602 A | 12/1996 |
| WO | WO 91/11826 | 8/1991 |
| WO | WO 02/13257 | 2/2002 |

OTHER PUBLICATIONS

Form PCT/ISA/210 International Search Report for International Application No. PCT/ZA2004/000005 completed Jul. 8, 2004.

Office Action for Application No. JP 2006-501327 mailed May 24, 2010 (received Jun. 15, 2010).

* cited by examiner

FAST SWITCHING POWER INSULATED GATE SEMICONDUCTOR DEVICE

CROSS-REFERENCE TO RELATED APPLICATIONS

This application is a continuation of U.S. patent application Ser. No. 10/542,720, now abandoned filed on Jan. 30, 2006, which claims the benefit of the filing date and priority to International Application No. PCT/ZA2004/000005 filed on Jan. 21, 2004, which claims the benefit of the filing date and priority to South African Application No. 2003/0552 filed on Jan. 21, 2003. All of the above applications are incorporated by reference in their entirety.

TECHNICAL FIELD

THIS invention relates to insulated gate semiconductor devices such as metal oxide silicon field effect transistors (MOSFET's), more particularly to such devices for use in power switching applications and to a method of driving such devices.

BACKGROUND ART

In known MOSFET structures, it is presently preferred to minimize the gate voltage $V_{GS}$ required for switching of the device and which then implies a relatively large input gate capacitance.

Capacitance inherent in the gate structures of insulated gate devices limits the switching speeds of these devices. It is also well known that the Miller effect has an influence on the input capacitance at the gate of devices of the aforementioned kind in that the input capacitance of a typical commercially available MOSFET varies during switching of the device. The input capacitance has a first value $C_{iiss}$ when the device is off and a second value $C_{fiss}$ when the device is on. The ratio of the second and first values for a known and commercially available IRF 740 power MOSFET is in the order of 2.5. It has been found that such a ratio impairs the switching speed of these devices.

The total switching time $T_s$ of the IRF 740 MOSFET to switch on is made up by the sum of a turn-on delay time $T_{don}$ of about 14 ns and a drain source voltage fall time $T_f$ of about 24 ns and is equal to about 38 ns. The corresponding time to switch off is about 77 ns. These times are too long for some applications.

OBJECT OF THE INVENTION

Accordingly, it is an object of the present invention to provide an insulated gate device and method and circuit of driving such a device with which the applicant believes the aforementioned disadvantages may at least be alleviated.

SUMMARY OF THE INVENTION

According to the invention an insulated gate device comprises a gate connected to a gate terminal and having a variable input capacitance at the gate terminal as the device is switched between an off state and an on state, a ratio between a final value of the capacitance when the device is on and an initial value of the capacitance when the device is off is smaller than 2.0.

The aforementioned ratio is preferably less than 1.5, more preferably less than 1.4, even more preferably less than 1.3, still more preferably less than 1.2 and most preferably substantially equal to 1.

The device may comprise a semiconductor device, preferably a field effect transistor (FET) more preferably a power metal oxide silicon field effect transistor (MOSFET) such as a V-MOS, D-MOS and U-MOS.

The MOSFET may have a vertical structure in that the gate and a source of the device are provided on one face of a chip body of the device and a drain of the MOSFET is provided on an opposite face of the body.

The device may comprise a capacitor connected between the gate terminal and the gate of the device.

The capacitor may be integrated on the chip body and in one embodiment may be superimposed on the gate of the device.

Alternatively, the capacitor is a discrete component connected in series between the gate and the gate terminal and packaged in the same package.

The gate may be connected directly to a fourth terminal of the device. In this specification the invariant device parameter (β) is used to denote the effective dielectricum thickness of a conduction channel of the device in the off state, which is defined as the product of an effective gate capacitance area (A) and the difference between an inverse of a first value of a gate capacitance of the insulated gate device, that is when the device is off and an inverse of a second value of the gate capacitance, that is when the device is on. That is:

$$\beta = A(1/C_{iiss} - 1/C_{fiss}) = \alpha_{max}.$$

According to one aspect of the invention there is provided an insulated gate device comprising a gate and an insulation layer at the gate, the layer having an effective thickness (d) of at least a quotient of the device parameter as defined and a ratio of maximum charge accommodatable on the gate and a minimum charge required on the gate for complete switching, minus one (1). That is:

$$d \geq d_{min} \approx \beta / [(Q_{G(max)}/Q_{G(min)}) - 1]$$

where $Q_{G(max)}$ is the maximum allowable steady state charge for safe operation and $Q_{G(min)}$ is the minimum charge required for complete switching.

According to another aspect of the invention there is provided an insulated gate device comprising a gate, the device having a capacitance at the gate which is a function of the effective thickness of an insulation layer at the gate, the effective thickness of the layer being selected to ensure that a first ratio between a final value of the capacitance when the device is on and an initial value of the capacitance when the device is off is smaller or equal to a second ratio of a maximum charge receivable on the gate and a charge required to reach a threshold voltage of the gate of the device.

According to yet another aspect of the invention there is provided an insulated gate device comprising a gate, the device having a capacitance at the gate which is a function of the effective thickness of an insulation layer at the gate, the effective thickness of the layer being selected to ensure that a first ratio between a final value of the capacitance when the device is on and an initial value of the capacitance when the device is off is smaller or equal to a second ratio of a maximum voltage applyable to the gate and a threshold voltage required on the gate to switch the device on.

According to yet another aspect of the invention there is provided a method of driving an insulated gate semiconductor device, the device comprising an insulation layer at a gate thereof providing a capacitance which varies between an initial value when the device is off and a final value when the device is on, the method comprising the step of depositing at least a Miller charge on the gate while the capacitance has said initial value.

The method preferably comprises the step of depositing substantially sufficient charge for a desired steady state switched on state of the device on the gate while the capacitance has said initial value.

The invention also extends to a drive circuit for a device as herein defined and/or described.

BRIEF DESCRIPTION OF THE
ACCOMPANYING DIAGRAMS

The invention will now further be described, by way of example only, with reference to the accompanying diagrams wherein:

FIG. 2($b$) is a diagrammatic representation of a gate structure of the MOSFET when it is partially on;

FIG. 2($c$) is a diagrammatic representation of a gate structure of the MOSFET when it is fully switched on;

FIG. 8($b$) are similar graphs for a MOSFET with a ratio $C_{fiss}/C_{iiss} \approx 1.63$;

FIG. 8($c$) are similar graphs for a MOSFET with a ratio $C_{fiss}/C_{iiss} \approx 1.34$;

FIG. 8($d$) are similar graphs for a MOSFET with the ratio $C_{fiss}/C_{iiss} \approx 1.17$;

DESCRIPTION OF PREFERRED
EMBODIMENTS OF THE INVENTION

Figure 1:
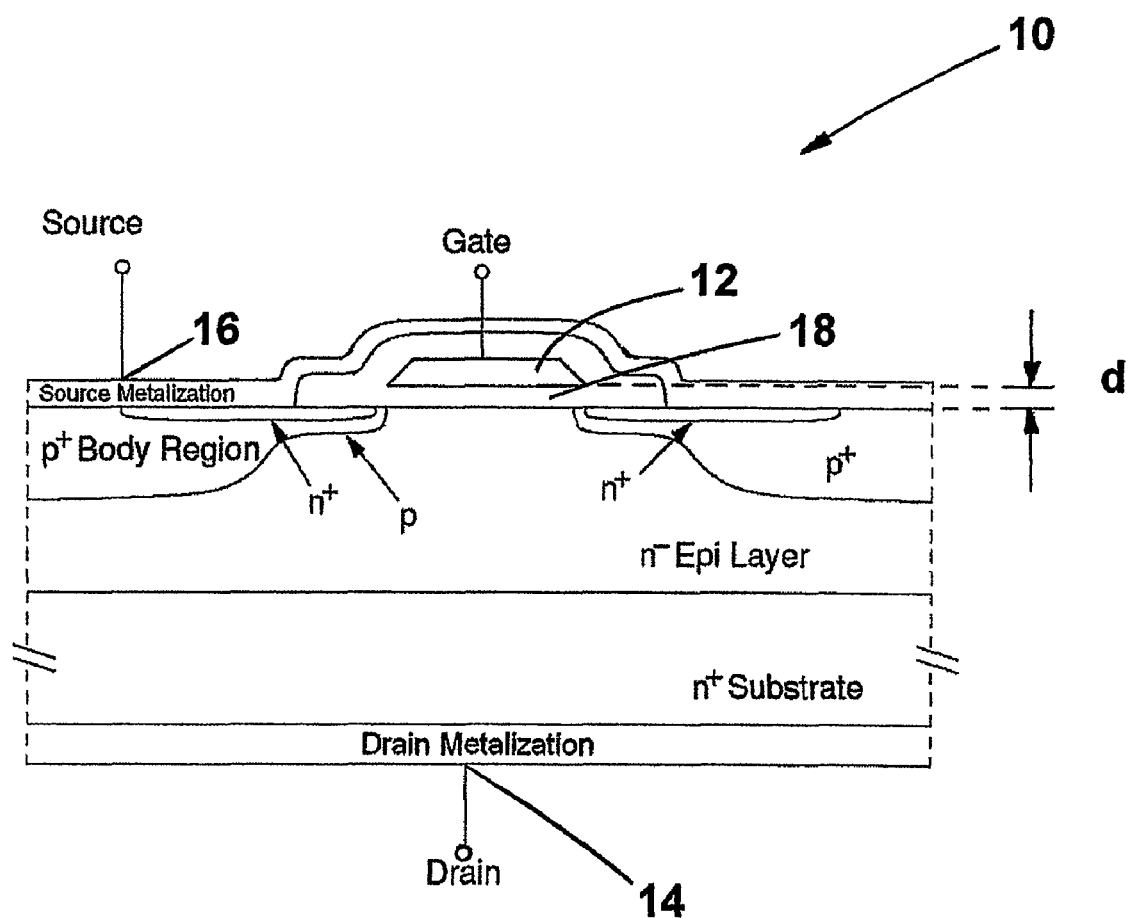
FIG. 1 is a schematic representation of a known insulated gate semiconductor device in the form of a power MOSFET.

A known insulated gate device in the form of a known power metal oxide silicon field effect transistor (MOSFET) is generally designated by the reference numeral 10 in FIG. 1.

The MOSFET 10 comprises a gate 12, a drain 14 and a source 16. The device 10 has a gate capacitance $C_G$ between the gate and the source.

It is well known that when a voltage $V_{GS}$ is applied to the gate as shown at 80 in FIG. 8($a$), charge is deposited on the gate causing the device to switch on and a voltage $V_{DS}$ to switch from a maximum value shown at 82 to a minimum value shown at 84. Similarly, when the charge is removed from the gate, the device is switched off and the voltage $V_{DS}$ switches to the maximum value.

The total switching time $T_s$ (illustrated in FIG. 8($a$)) is constituted by the sum of a turn-on delay time $T_{don}$ and a rise time $T_r$. The turn-on delay time is defined to be the time between rise of the gate-to-source voltage $V_{GS}$ above 10% of its maximum value and the onset of drain-to-source conduction, that is when the voltage $V_{DS}$ has decreased by 10%. The rise time is defined as the time interval corresponding to a decrease in $V_{DS}$ from 90% to 10% of its maximum value when the device is switched on.

Figure 2A:
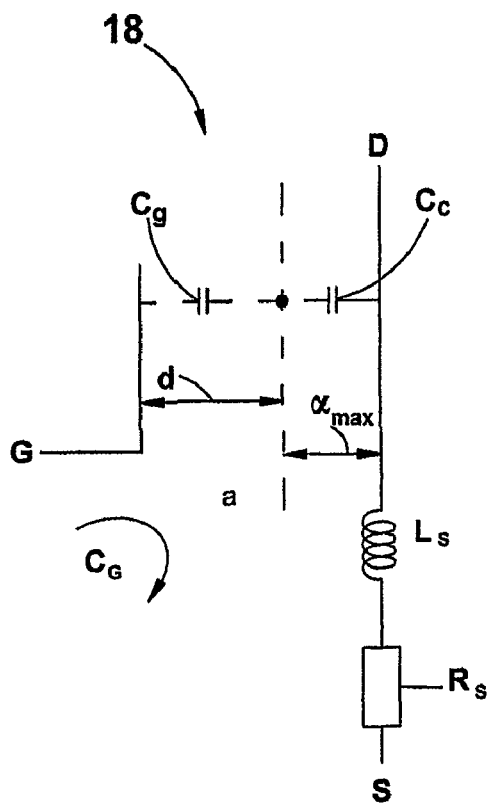
FIG. 2($a$) is a diagrammatic representation of a gate structure of the MOSFET while it is off.
Figure 2B:
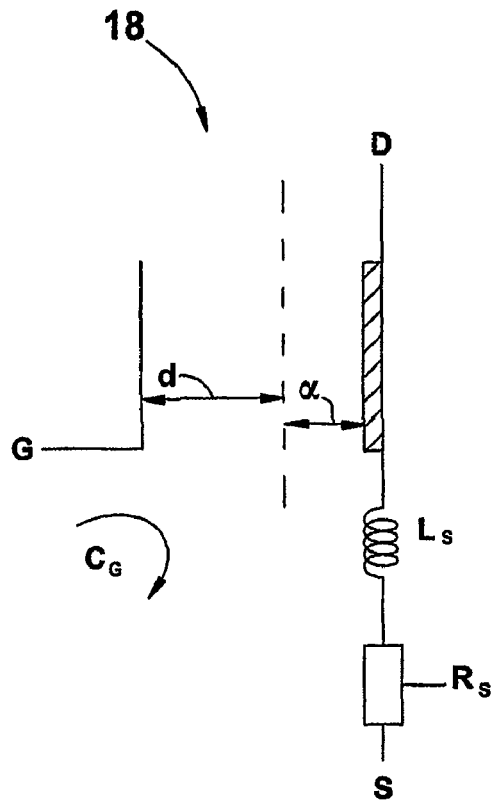
Figure 2C:
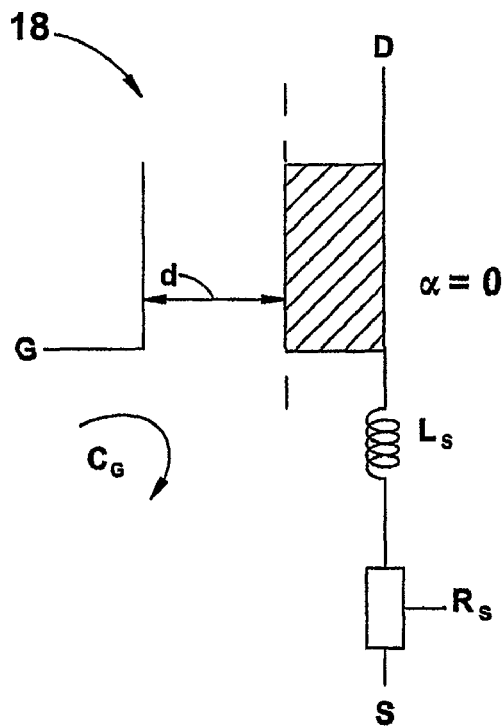

Referring to FIGS. 2($a$) to 2($c$), in the known devices, the gate capacitance $C_G$ may be modelled as effectively comprising two capacitors $C_g$ and $C_c$ in series. As shown in FIGS. 2($a$) to 2($c$) the first capacitor $C_g$ is an invariable capacitor and its value scales to 1/d, being the effective thickness (d) of an insulation layer 18 at the gate of the device. The second capacitor $C_c$ is a variable capacitor having a value of $\infty$ when the device is switched on as shown in FIG. 2($c$), a value of $A/\alpha_{max}$ when the device is off as shown in FIG. 2($a$) and a value of $A/\alpha$ (with $0<\alpha<\alpha_{max}$) while the capacitance changes, i.e. the channel switches off or on. The gate capacitance $C_G$ may hence be written as:

$$C_G = 1/[1/C_g(d) + 1/C_c(\alpha)]$$
$$= A/(d+\alpha)$$

where A is an effective area, which includes proper normalization constants. Thus, $\alpha$ is a maximum ($\alpha_{max}$) when the device is switched off as shown in FIG. 2($a$) and $\alpha=0$ when the device is switched on as shown in FIG. 2($c$).

Hence, the device has a gate or input capacitance with a first value $C_{iiss}$ when the device is off and a second value $C_{fiss}$ when the device is on. The capacitance retains the first value until the Miller effect takes effect.

An effective maximum conduction channel dielectricum thickness ($\beta$)=$\alpha_{max}$ is defined, which is proportional to a difference in the inverse of the gate capacitance when the device is off $C_{iiss}$ and when the device is on $C_{fiss}$, that is:

$$\beta \equiv A(1/C_{iiss} - 1/C_{fiss}) = \alpha_{max}.$$

The ratio $C_{fiss}/C_{iiss}$ may be written as $$\frac{d+\alpha_{max}}{d}.$$

Figure 3:
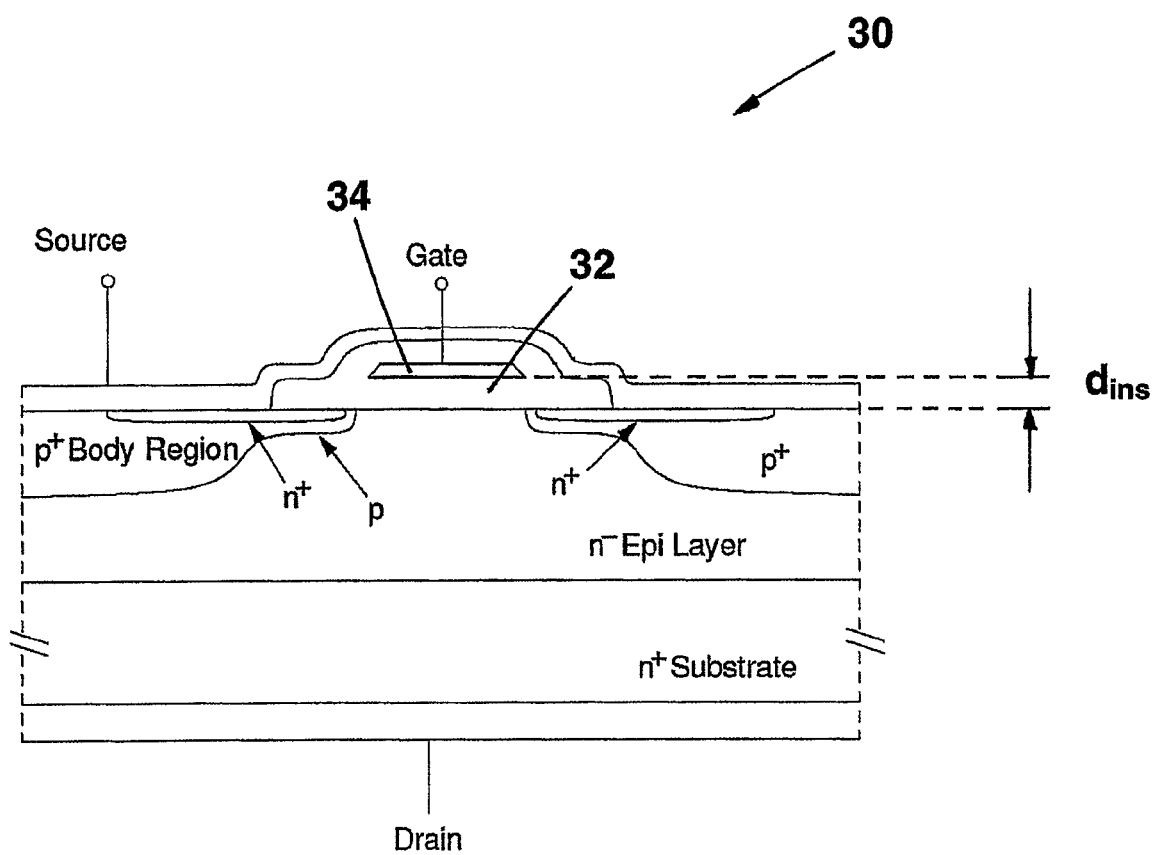
FIG. 3 is a schematic representation of a first embodiment of a power MOSFET according to the invention.

As shown in FIG. 3, according to the invention by increasing the effective thickness $d_{ins}$ of the insulation layer 32 at the gate 34 and hence by decreasing the gate capacitance $C_G$, the total switching time $T_s$ of a MOSFET 30 may be decreased. A minimum value for the effective thickness $d_{ins}$ is given by:

$$d_{ins} \geq \beta/[(Q_{G(max)}/Q_{G(min)})-1]$$

wherein $Q_{G(min)}$ is the minimum charge required for complete switching and wherein $Q_{G(max)}$ is the maximum allowable gate charge on the device which includes a safety margin. Destruction will occur when $Q \geq Q_{G(max)}$.

Defining $V_{GS(min)}$ as the minimum gate voltage for complete switching and $V_{GS(max)}$ as the maximum allowable gate voltage on the device, before damage to the device, it is known that $Q_{G(max)}/Q_{G(min)} > V_{GS(max)}/V_{GS(min)}$. This inequality implies a slightly larger limit than that calculated from the charge ratios $Q_{G(max)}/Q_{G(min)}$:

$$d_{ins} \geq \beta / [(V_{GS(max)}/V_{GS(min)}) - 1]$$

With this minimum effective thickness for $d_{ins}$, the switching time of the device is mainly limited by the gate source inductance and capacitance.

By increasing $d_{ins}$ beyond this minimum, allows for reducing the rise or fall time by compensating for the source inductance $L_s$ voltage $\in_s$ during switching and which is:

$$\in_s = L_s di/dt + iR_s$$

$$\in_{s(max)} \approx L_s I_{DS(max)}/T_s + I_{DS(max)} R_s.$$

In Table 1 there are provided relevant details of four differently modified MOSFET's with progressively decreasing gate capacitance, $C_G$.

TABLE 1

| No. | Modified Input Gate Capacitance $C_{iiss}$, $C_{fiss}$ (nF) | | $\dfrac{C_{fiss}}{C_{iiss}}$ | Applied Gate Voltage $V_{GS}$ (volt) | Initial & Final Gate Charge Transferred $C_{iiss}V_{GS}$ & $C_{fiss}V_{GS}$ (nC) | | Turn-on Delay Time Predicted & Observed $T_{d(on)}$ (ns) | | Measured Switching Time $T_s$ (ns) |
|---|---|---|---|---|---|---|---|---|---|
| i | 1.2 | 2.6 | 2.16 | 15 | 18 | 40 | 6.3 | 6 (20 ns/div) | 38 |
| ii | 0.86 | 1.4 | 1.63 | 32 | 28 | 45 | 5.3 | 5 (20 ns/div) | 20 |
| iii | 0.58 | 0.78 | 1.34 | 120 | 70 | 94 | 4.4 | <2 (10 ns/div) | <4 |
| iv | 0.35 | 0.41 | 1.17 | 200 | 70 | 82 | 3.4 | <2 (10 ns/div) | <4 |

For a conventional IRF 740 MOSFET:

$$\in_{s(max)} \approx 7.4 \text{ nH}(40 \text{ A}/27 \text{ ns}) + 4 \text{ volt} = 15 \text{ volt}$$

$$V_{G(internal)} \approx V_{GS(max)} - \in_{s(max)} = 20 \text{ volt} - 15 \text{ volt} = 5 \text{ volt}$$

For the device in row iv of Table 1

$$\in_{s(max)} \approx 7.4 \text{ nH}(40 \text{ A}/2.5 \text{ ns}) + 5 \text{ volt} = 123 \text{ volt}$$

$$V_{G(internal)} \approx V_{GS(max)} - \in_{s(max)} \approx 200 \text{ volt} - 123 \text{ volt} = 77 \text{ volt}$$

Figure 4:
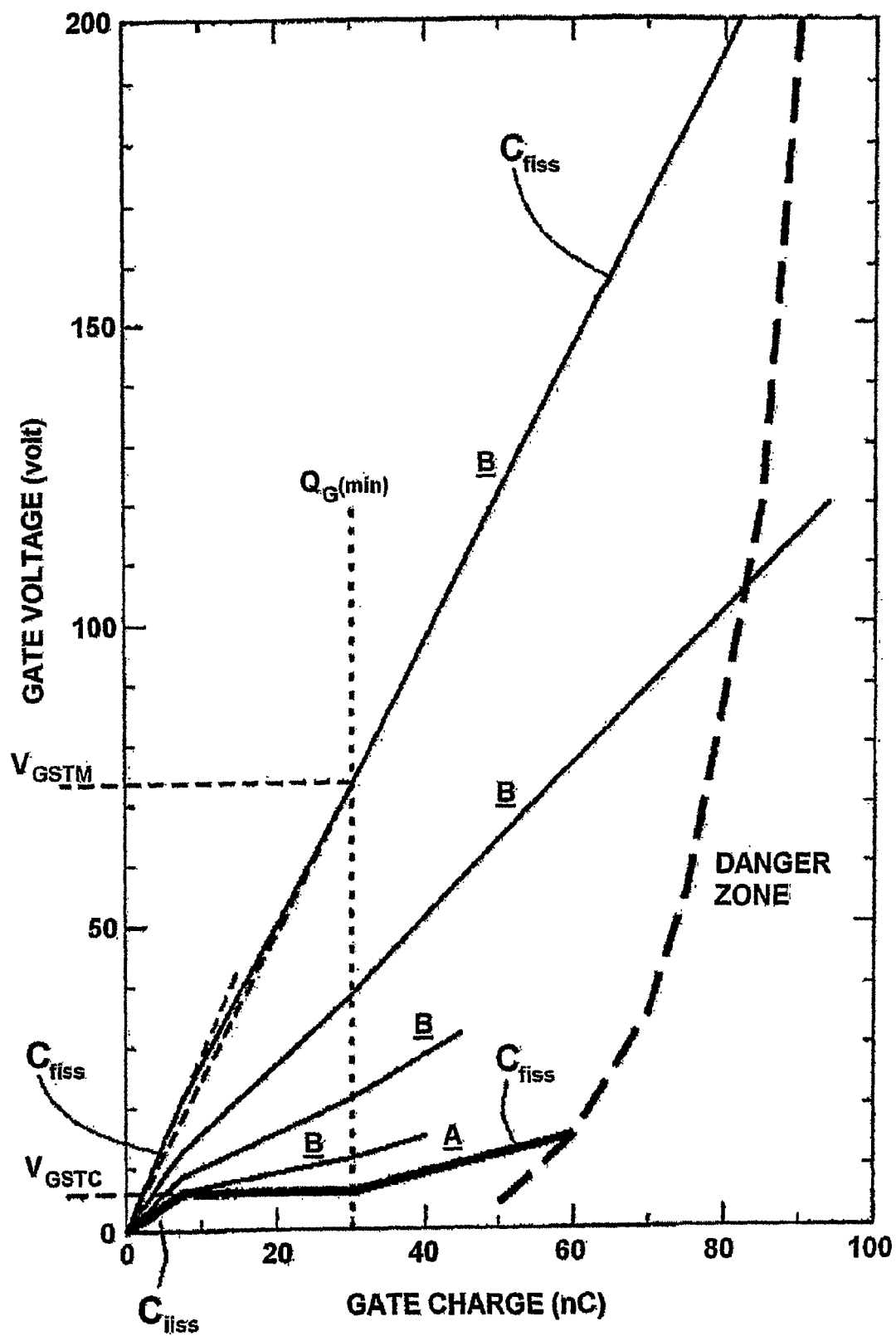
FIG. 4 is a typical graph for the steady state of gate-to-source voltage against total gate charge marked A of a conventional MOSFET as well as various similar graphs marked B for MOSFET's according to the invention.

From this example it is clear that $V_{G(internal)}$ is still larger than the modified threshold gate voltage $V_{GSTM} = V_{GS(min)} = 73$ volt, shown in FIG. 4, and the slow rise time due to the Miller effect is thus effectively counteracted. It follows that minimization of the product $L_sC_{iiss}$ minimizes the switching time $T_S$ of the device, assuming the combined gate and source serves resistance is negligible.

If a gate voltage, $V_{GS}$, substantially larger than the threshold gate voltage, $V_{GST}$, is supplied in a time much shorter than the turn-on delay time, the latter may be approximated as:

$$T_{don} \approx (2\pi/3)(L_SC_{iiss})^{1/2}.$$

It can be shown that:

$$T_s \propto 1/d_{ins}^{1/2}$$

which indicates that the total switching time is reduced by increasing the effective thickness $d_{ins}$ of layer 32.

Another important feature of the invention is that at least a minimum required charge $Q_{G(min)}$ or Miller charge (see FIG. 4) must be transferred to the gate while the gate capacitance assumes its lower initial value of $C_{fiss}$ rather when the larger input capacitance $C_{fiss}$ determines the final switched state of the MOSFET. Hence the charge to be transferred is $$Q_G = V_{GS}C_{iiss} \geq Q_{G(min)}.$$

Thus, the following minimum source to gate voltage must be applied.

$$V_{GS} \geq V_{GS}(\min) = Q_{G(min)}/C_{iiss}.$$

Also, $$Q_G = V_{GS}C_{fiss} \leq Q_{G(max)}$$

and the corresponding voltage limit is given by $$V_{GS} \leq V_{GS(max)} = Q_{G(max)}/C_{fiss}.$$

This could also be written as:

$$C_{fiss}/C_{iiss} \leq Q_{G(max)}/Q_{G(min)}$$

or $$C_{fiss}/C_{iiss} \leq V_{GS(max)}/V_{GS(min)}.$$

Oscillograms illustrating $V_{GS}$ and $V_{DS}$ against time during switching on for each of the devices referenced i to iv in Table 1 are shown in FIGS. 8(*a*) to 8(*d*) respectively. The decrease in gate capacitance is clear from the second column in the Table, and the larger required input $V_{GS}$ and decreasing switching times are clear from both the Table and the oscillograms.

The last two devices iii and iv in Table 1 with minimized gate capacitance and wherein the ratio $C_{fiss}/C_{iiss} \leq 1.34$, represent MOSFET's close to optimum, since the initial gate charge is already more than the minimum gate charge $Q_{G(min)}$ (shown in FIG. 4) and which for a typical MOSFET is in the order of 30 nC) required for complete switching. The increased gate to source input voltage $V_{GS}$ and spectacular drop in total switching times $T_s$ are noticeable.

In FIG. 4, comparative graphs for a known MOSFET is shown at A and for MOSFET's according to the invention at B. The ratio $C_{fiss}/C_{iiss}$ for the known IRF 740 MOSFET is in the order of 2.5 whereas the same ratio for the last device according to the invention in Table 1 is 1.17. The device according to the invention has a total switching time of <4 ns which is about an order faster than the 38 ns of the known and comparable IRF 740 MOSFET.

Figure 5:
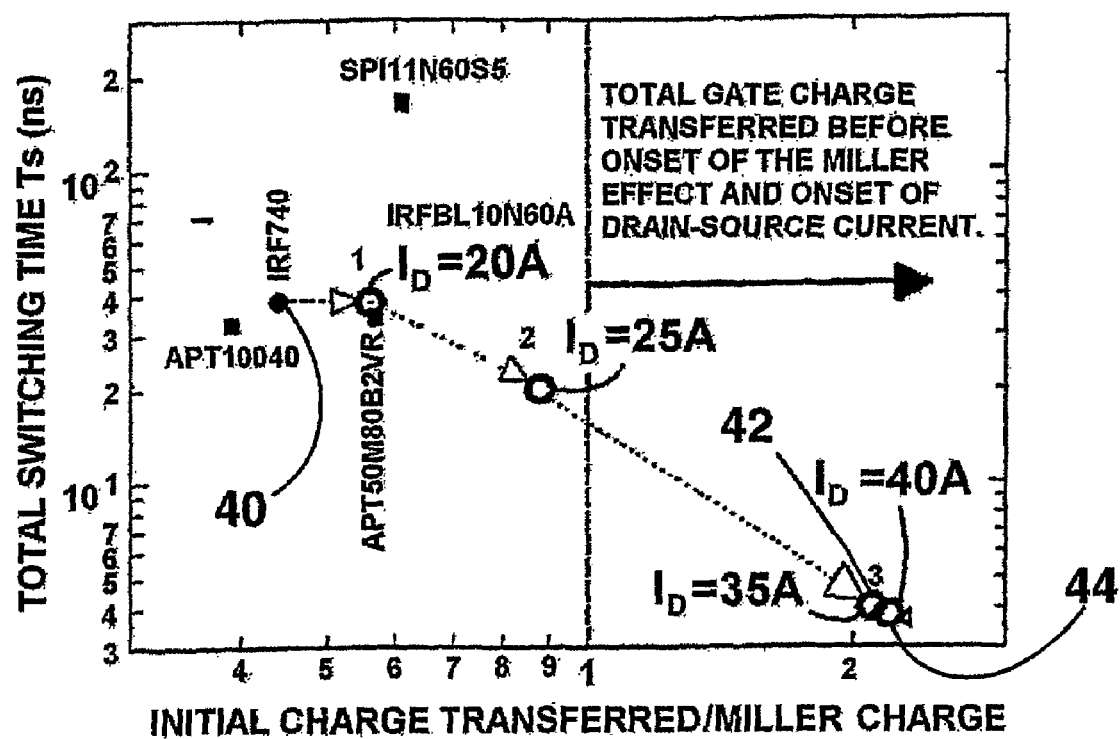
FIG. 5 is a graph of total switching time against a ratio of initial charge transferred to the gate and the Miller charge of a variety of MOSFET's.

In FIG. 5 there is shown a graph of total switching time as a function of the initial gate charge relative to the minimum gate charge $Q_{G(min)}$. The circle at 40 represents standard operation of an IRF 740 MOSFET. However, the circles at 42 and 44 illustrate the improved operation of the MOSFET's referenced iii and iv in Table 1.

Figure 6:
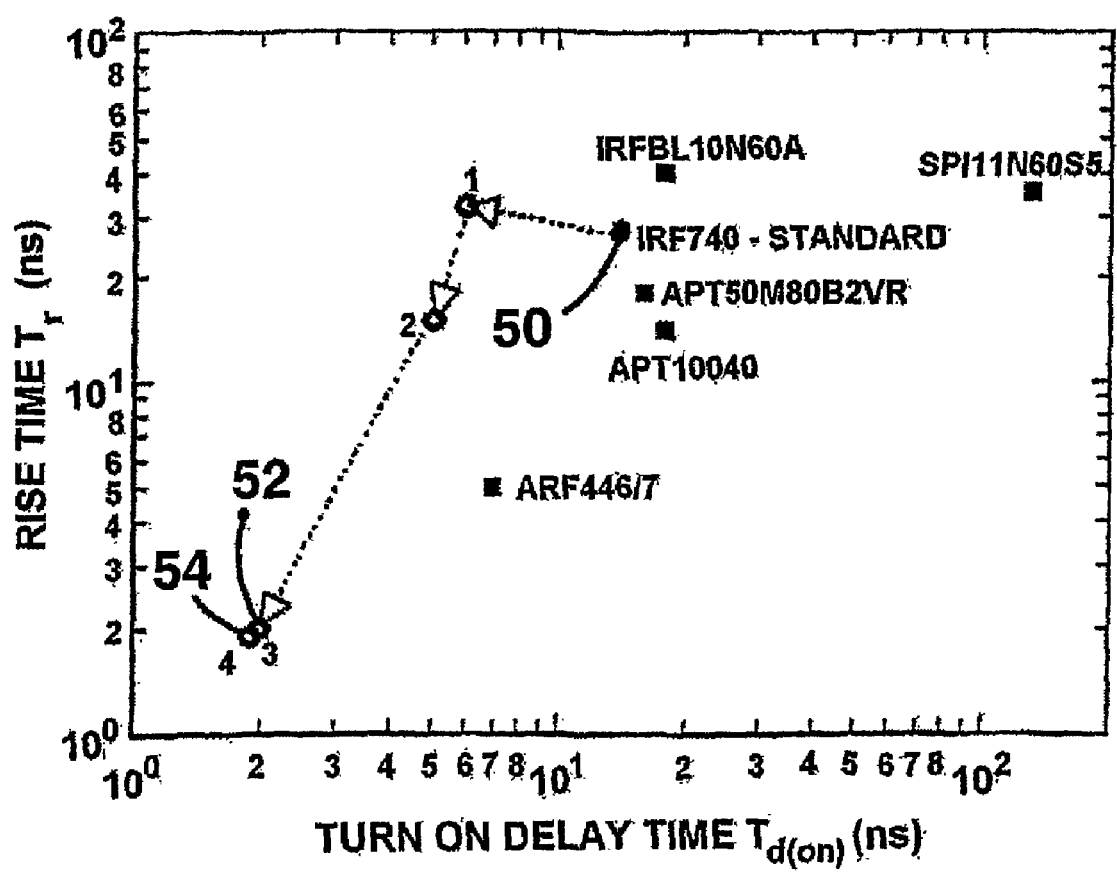
FIG. 6 is a graph of drain-source rise time against turn-on delay time of a variety of MOSFET's.

In FIG. 6 there is shown a graph of rise time $T_r$ against turn-on delay time $T_{don}$ for a plurality of different devices. The mark at 50 indicates standard operation of an IRF 740 MOSFET and the circles 52 and 54 indicate the improvement in total switching time $T_s$ of the devices referenced iii and iv in Table 1 to a point where the rise time becomes negligible and the total switching time $T_S$ approximates the turn-on delay time $T_{don}$.

Figure 7:
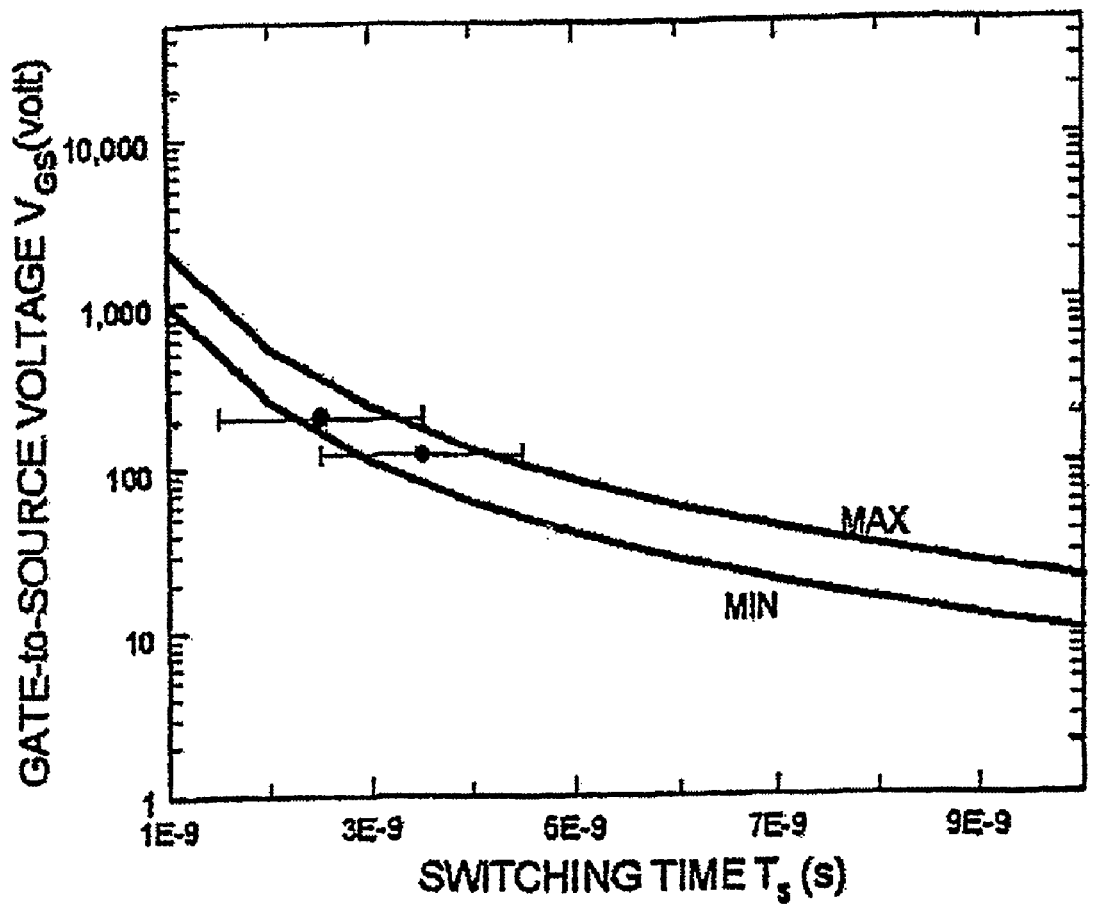
FIG. 7 is a graph of minimum and maximum gate source voltages required on a MOSFET according to the invention against total switching time.
Figure 8A:
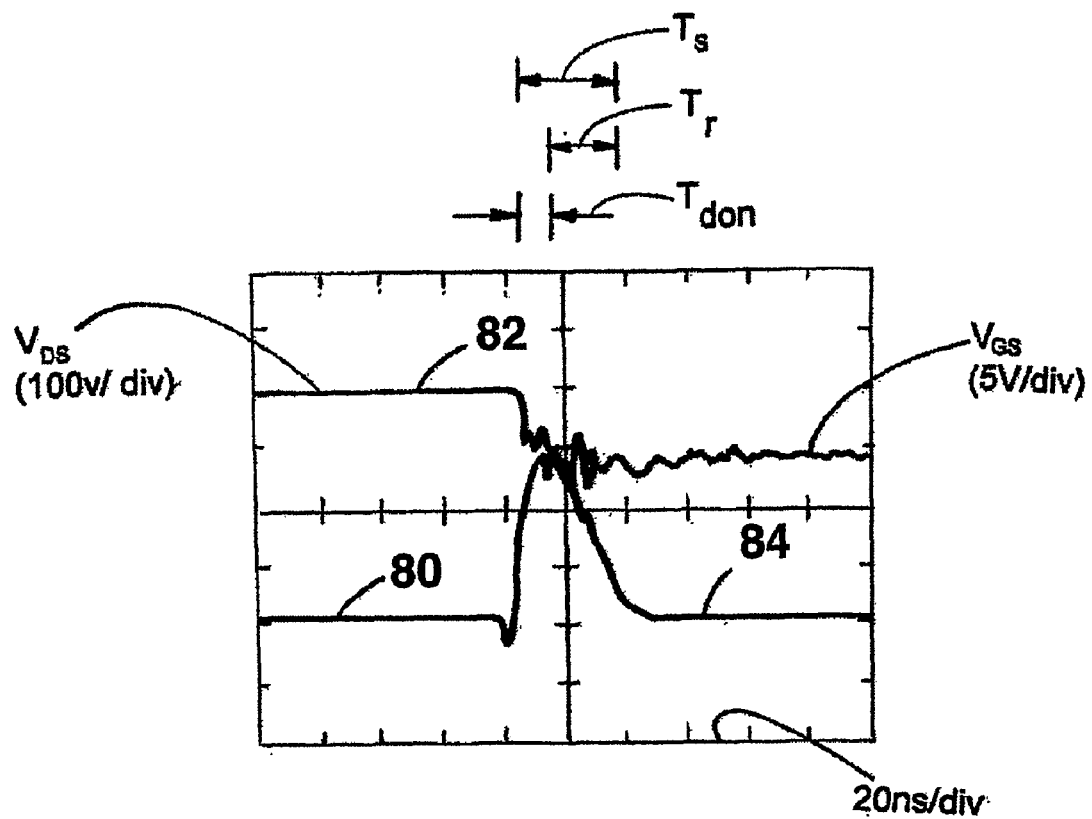
FIG. 8($a$) are oscillographs of $V_{GS}$ and $V_{DS}$ against time for a MOSFET with a ratio $C_{fiss}/C_{iiss} \approx 2.16$.
Figure 8B:
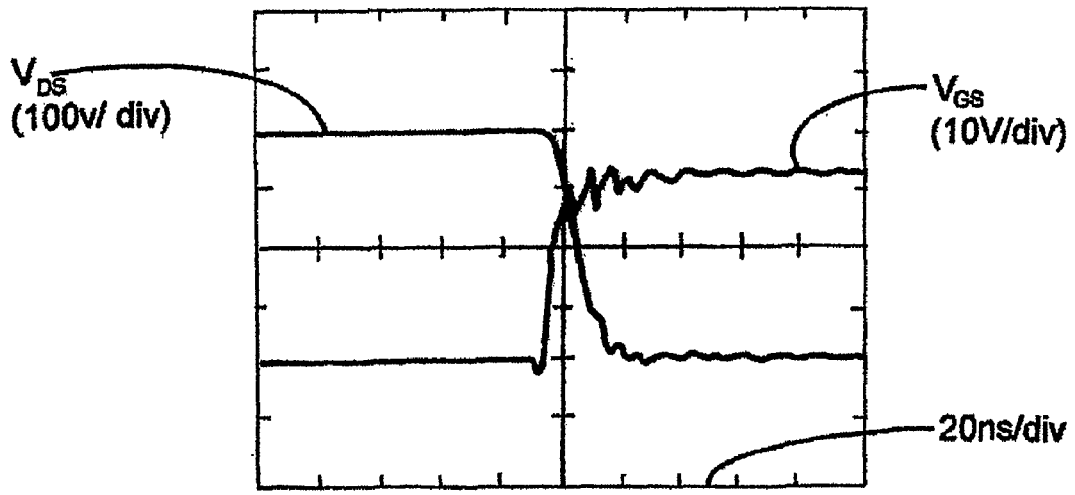
Figure 8C:
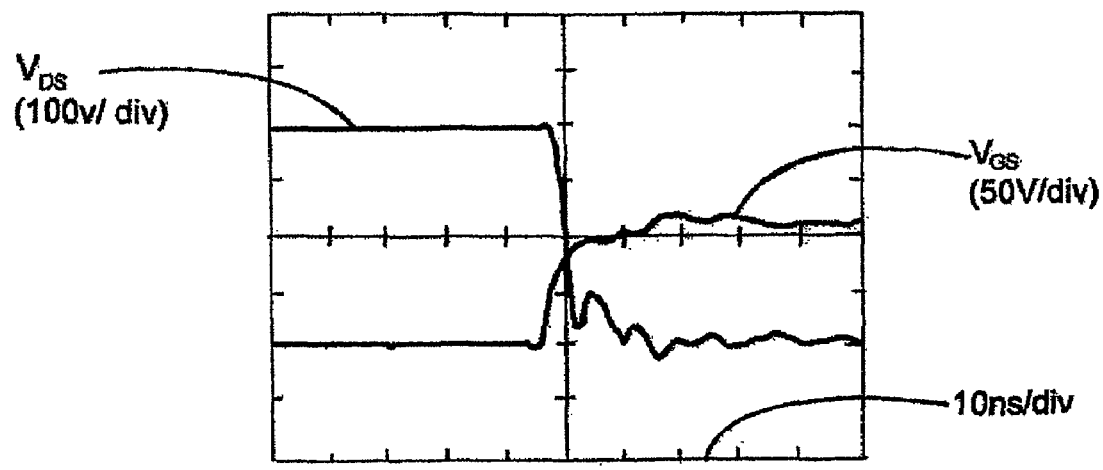
Figure 8D:
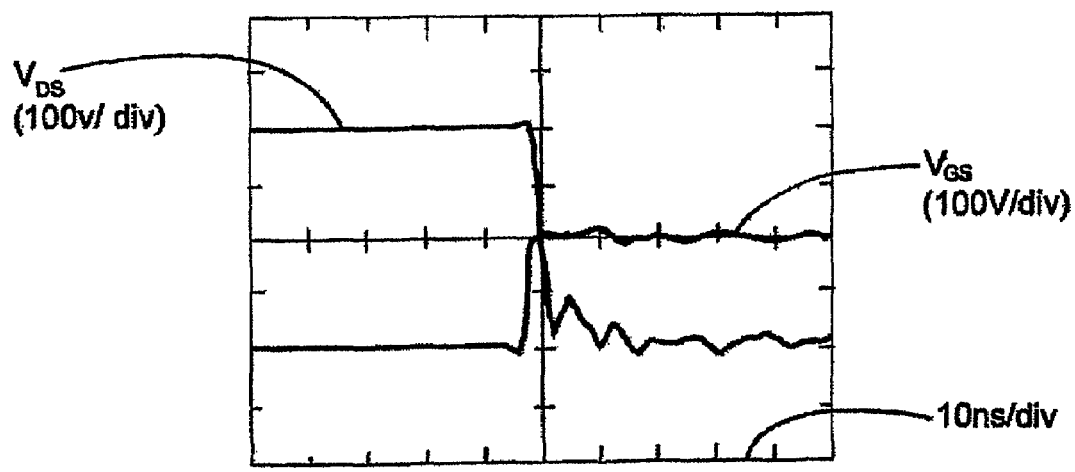

It can further be shown that the product of $V_{GS}$ and the square of the total switching time $T_S$ is band limited as follows:

$$(2\pi/3)^2 Q_{G(min)} L_S \leq V_{ES} T_S \leq (2\pi/3)^2 Q_{G(max)} L_S$$

which means that the operating voltage $V_{GS}$ of the device according to the invention (which is much higher than the corresponding voltage for prior art devices) is limited as follows:

$$(2\pi/3)^2 Q_{G(min)} L_S/T_S^2 \leq V_{GS} \leq (2\pi/3)^2 Q_{G(max)} L_S/T_S^2$$

and as illustrated in FIG. 7. The internal source resistance $R_S$ has a negligible effect on these expressions and is therefore omitted for better clarity.

Hence, by minimizing the product of Miller charge or $Q_{G(min)}$ and $L_S$, reduced total switching times $T_S$ and required operating voltages $V_{GS}$ may be achieved.

Figure 9:
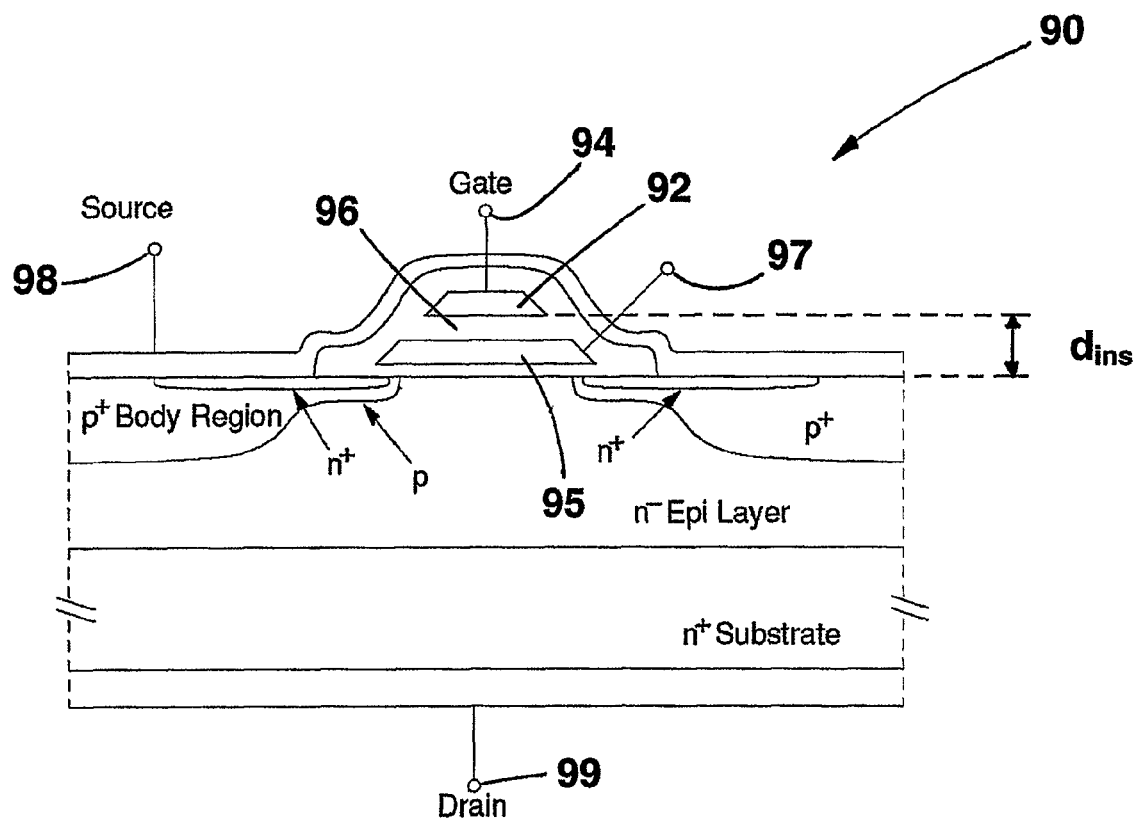
FIG. 9 is a schematic representation of a second embodiment of the MOSFET according to the invention.

In FIG. 9 there is shown a further embodiment of the device according to the invention and designated 90. The device comprises a gate 92, connected to a gate terminal 94. The insulation layer with increased effective thickness $d_{ins}$ is shown at 96. Conventional source and drain terminals are shown at 98 and 99 respectively. A further and so-called floating gate 95 is connected to a fourth and user accessible terminal 97.

Figure 10:
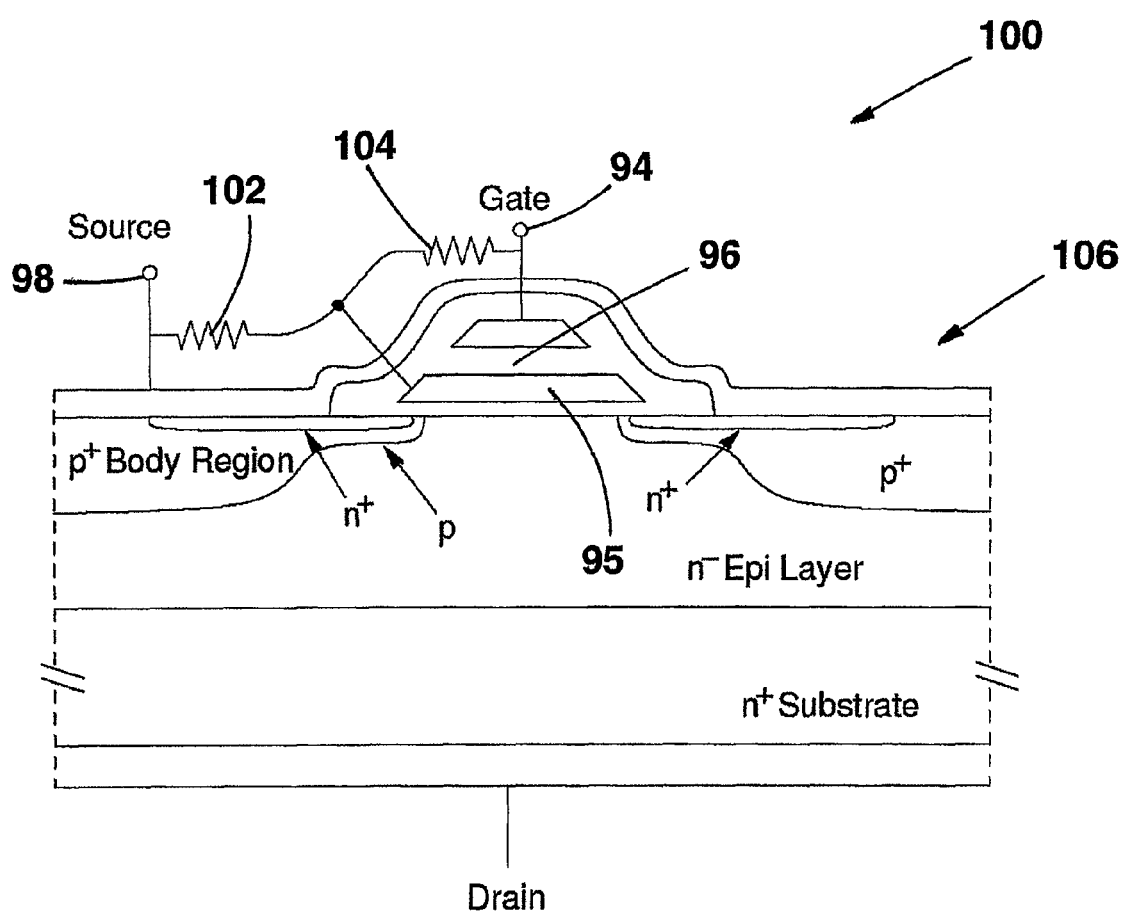
FIG. 10 is a schematic representation of a third embodiment of the MOSFET according to the invention.

In FIG. 10, yet another embodiment of the device according to the invention is shown at 100. In this case, the further gate 95 is not connected to a user accessible terminal, similar to terminal 97, but biasing resistors 102 and 104 may be provided as discrete components or integral with the chip body 106.

Figure 11:
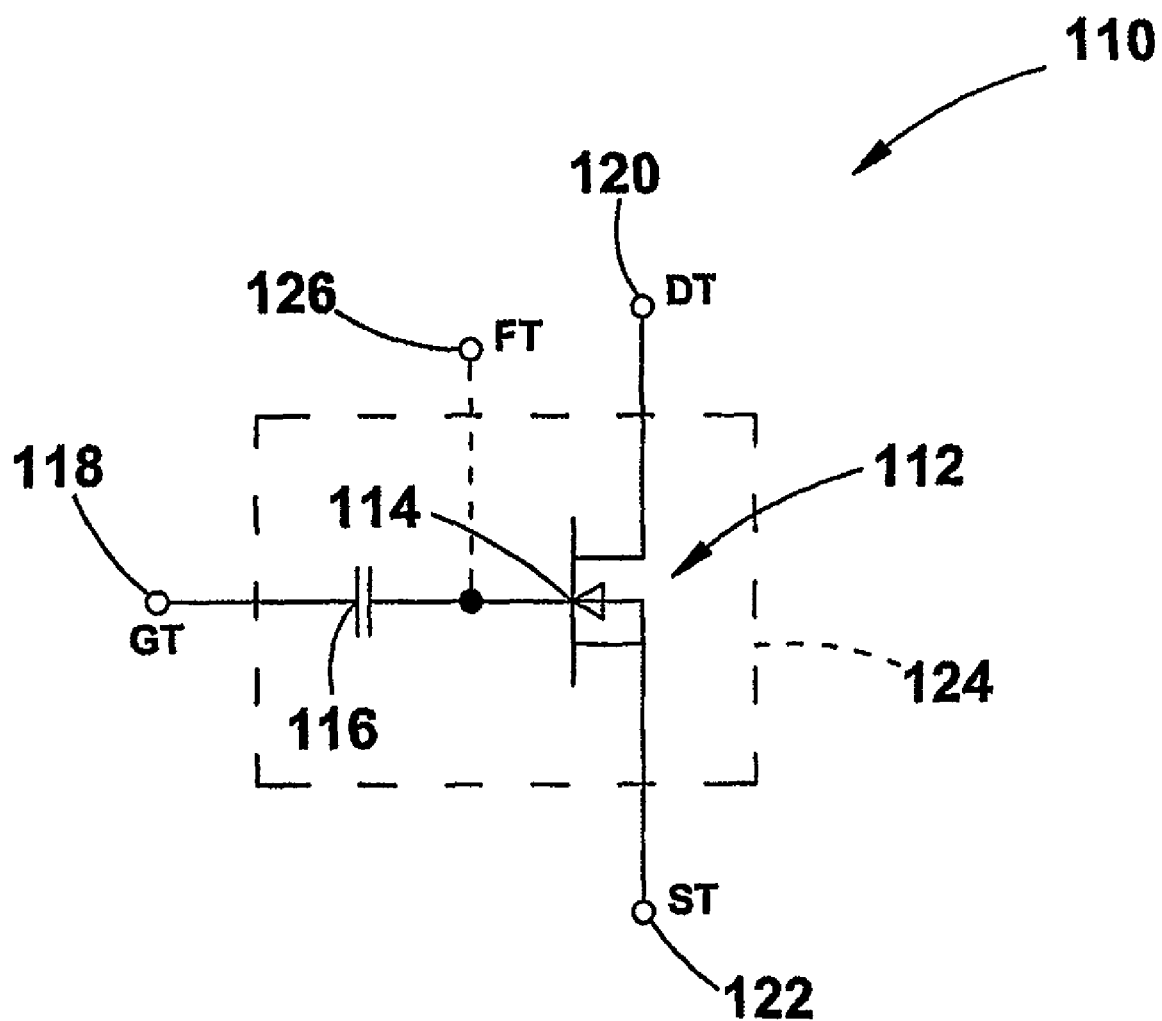
FIG. 11 is a block diagram of another embodiment of the device according to the invention.

In FIG. 11, still a further embodiment of the device is shown at 110. The device 110 comprises a conventional MOSFET 112 having a gate 114. A capacitor 116 is connected in series between the gate and a gate terminal 118 of the device. The drain and source of the MOSFET are connected to a drain terminal 120 and source terminal 122 respectively. The device is packaged in a single package 124 providing the aforementioned terminals. An optional fourth terminal 124 connected to the gate 114 may also be provided. The capacitor 116 may be integrated with the MOSFET on a single chip. In other embodiments, the capacitor may be a discrete capacitor, but packaged in the same package 124. In still other embodiments, the optional fourth terminal may be omitted and biasing resistors between the gate terminal and the gate and between the gate and the source may be provided in the same package.

Figure 12:
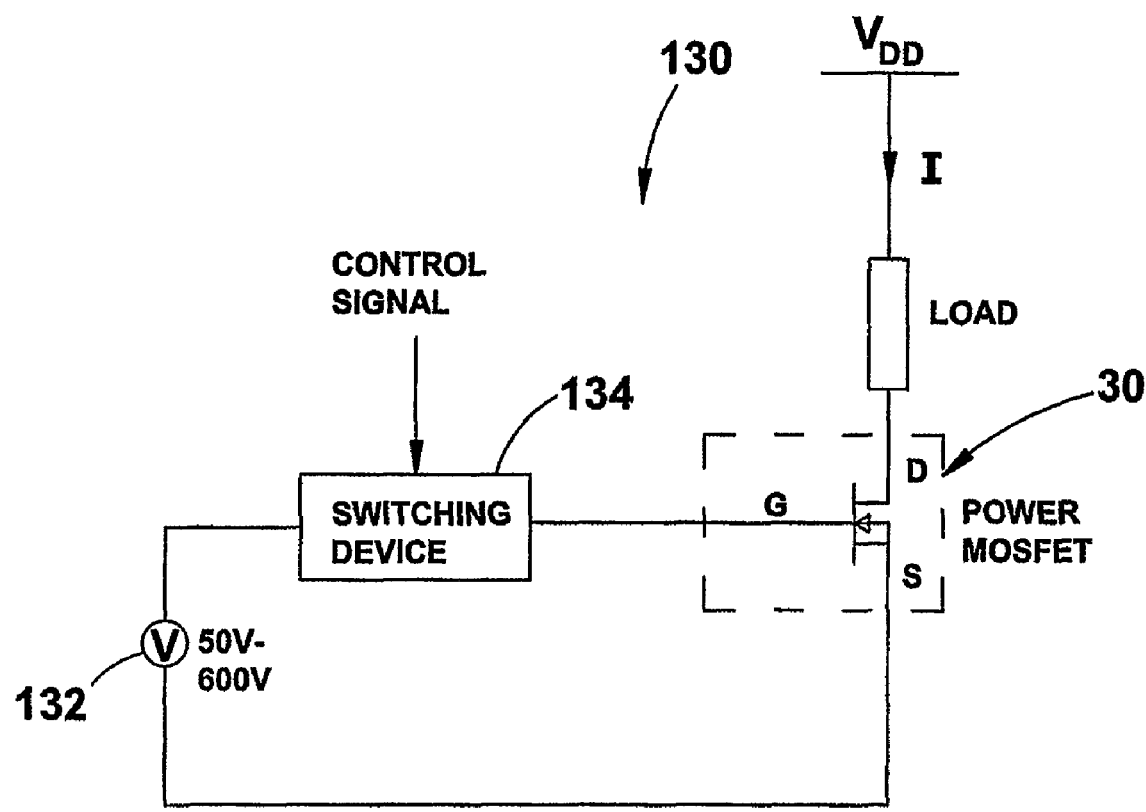
FIG. 12 is a basic diagram of drive circuit for a device according to the invention.

In FIG. 12 there is shown a diagram of a drive circuit 130 for the device 30, 90, 100 and 110 according to the invention. The drive circuit comprises a voltage source 132 (typically 50V-600V and which may even exceed $V_{DD}$) and a fast switching device 134 connected in a circuit and in close proximity to the gate terminal of the device according to the invention to reduce unwanted inductance in the gate source circuit.

In use, the fast switching device 134 is controlled to apply a voltage which is sufficiently larger than the threshold voltage of the device to the gate of the device. As is clear from table 1, this voltage is larger than the voltage required in conventional devices. Due to the reduced LCR parameters in the gate source circuit, charge transfer to the gate of the device will be faster than with conventional devices which results in the faster switching times in the drain source circuit as shown in table 1.

The invention claimed is:

1. An insulated gate device comprising a source connected to a source terminal, a gate connected to a gate terminal and input capacitance means providing capacitance between the gate terminal and the source terminal, wherein a value of the capacitance is a function of an effective thickness of an insulation layer at the gate, the effective thickness of the insulation layer being selected to ensure that a first ratio ($C_{fiss}/C_{iiss}$) between a final value ($C_{fiss}$) of the capacitance when the device is on and an initial value ($C_{iiss}$) of the capacitance when the device is off is smaller or equal to a second ratio ($Q_{G(max)}/Q_{G(min)}$) of a maximum allowable gate charge ($Q_{G(max)}$) and a minimum charge ($Q_{G(min)}$) required on the gate for complete switching of the device and such that $1 < C_{fiss}/C_{iiss} < 2.0$.

2. A device as claimed in claim 1 comprising a power metal oxide silicon field effect transistor (MOSFET).

3. A device as claimed in claim 1 wherein said input capacitance means provides input capacitance such that the ratio ($C_{fiss}/C_{iiss}$) is $1 < C_{fiss}/C_{iiss} < 1.5$.

4. A device as claimed in claim 3 wherein said input capacitance means provides input capacitance such that the ratio ($C_{fiss}/C_{iiss}$) is $1 < C_{fiss}/C_{iiss} < 1.2$.

5. A device as claimed in claim 2 wherein the MOSFET has a vertical structure in that the gate and the source of the device are provided on one face of a chip body of the device and a drain of the MOSFET is provided on an opposite face of the chip body, wherein said input capacitance means comprises a series capacitor between the gate terminal and the gate of the device.

6. A device as claimed in claim 1 wherein the gate is connected directly to an additional terminal of the device.

7. An insulated gate device comprising a source connected to a source terminal, a gate connected to a gate terminal and input capacitance means providing capacitance between the gate terminal and the source terminal, wherein a value of the capacitance is a function of an effective thickness of an insulation layer at the gate, the effective thickness of the insulation layer being selected to ensure that a first ratio ($C_{fiss}/C_{iiss}$) between a final value ($C_{fiss}$) of the capacitance when the device is on and an initial value ($C_{iiss}$) of the capacitance when the device is off is smaller or equal to a second ratio ($V_{GS(max)}/V_{GS(min)}$) of a maximum allowable gate voltage ($V_{GS(max)}$) and a minimum gate voltage ($V_{GS(min)}$) for complete switching of the device and such that $1 < C_{fiss}/C_{iiss} < 2.0$.

8. A device as claimed in claim 7, comprising a power metal oxide silicon field effect transistor (MOSFET).

9. A device as claimed in claim 8, wherein the MOSFET has a vertical structure in that the gate and the source of the device are provided on one face of a chip body of the device and a drain of the MOSFET is provided on an opposite face of the chip body, wherein said input capacitance means comprises a capacitor between the gate terminal and the gate of the device.

10. A device as claimed in claim 7, wherein said input capacitance means provides input capacitance such that the ratio ($C_{fiss}/C_{iiss}$) is $1<C_{fiss}/C_{iiss}<1.5$.

11. A device as claimed in claim 10, wherein said input capacitance means provides input capacitance such that the ratio ($C_{fiss}/C_{iiss}$) is $1<C_{fiss}/C_{iiss}<1.2$.

12. A device as claimed in claim 7, wherein the gate is connected directly to an additional terminal of the device.

13. An insulated gate device comprising a gate and an insulation layer at the gate, the insulation layer having an effective thickness (d) of at least a quotient of a device parameter ($\beta$) and a ratio of maximum allowable gate charge ($Q_{G(max)}$) and a minimum charge ($Q_{G(min)}$) required on the gate for complete switching, minus one (1), $d \geq \beta/[(Q_{G(max)}/Q_{G(min)})-1]$, the device parameter ($\beta$) being equal to the product of an effective gate capacitance area (A) and a difference between an inverse of a first value ($1/C_{iiss}$) of a gate capacitance of the insulated gate device, that is when the device is off and an inverse of a second value ($1/C_{fiss}$) of the gate capacitance, that is when the insulated gate device is on, $\beta=A(1/C_{iiss}-1/C_{fiss})$ and such that $1<C_{fiss}/C_{iiss}<2.0$.

14. A device as claimed in claim 13, comprising a power metal oxide silicon field effect transistor (MOSFET).

15. A device as claimed in claim 14, wherein the MOSFET has a vertical structure in that the gate and a source of the device are provided on one face of a chip body of the device and a drain of the MOSFET is provided on an opposite face of the chip body, and further comprising a gate terminal and a series capacitor between the gate terminal and the gate of the device.

16. A device as claimed in claim 13, wherein the ratio ($C_{fiss}/C_{iiss}$) is $1<C_{fiss}/C_{iiss}<1.5$.

17. A device as claimed in claim 16, wherein the ratio ($C_{fiss}/C_{iiss}$) is $1<C_{fiss}/C_{iiss}<1.2$.

18. A device as claimed in claim 13, wherein the gate is connected directly to an additional terminal of the device.

* * * * *